United States Patent [19]

Noraz et al.

[11] Patent Number: 5,404,497
[45] Date of Patent: Apr. 4, 1995

[54] COMPACT FAIL SAFE INTERFACE AND VOTING MODULE INCLUDING THE COMPACT FAIL SAFE INTERFACE

[75] Inventors: Serge Noraz, Meylan; Michel Prunier, Domene, both of France

[73] Assignee: Merlin Gerin, France

[21] Appl. No.: 915,234

[22] Filed: Jul. 20, 1992

[30] Foreign Application Priority Data

Jul. 29, 1991 [FR] France .................... 91 09709

[51] Int. Cl.⁶ .................... G06F 13/00; H03L 1/02
[52] U.S. Cl. .................... 395/575
[58] Field of Search ............ 395/575; 331/57

[56] References Cited

U.S. PATENT DOCUMENTS

| | | | |
|---|---|---|---|
| 3,824,408 | 7/1974 | Brunel | 307/214 |
| 3,900,746 | 8/1975 | Kraft et al. | 307/264 |
| 4,283,690 | 8/1981 | Tarbouriech | 331/111 |
| 4,743,782 | 5/1988 | Nelson et al. | 307/475 |
| 5,180,995 | 1/1993 | Hayashi et al. | 331/57 |
| 5,208,553 | 5/1993 | Rice | 330/286 |

FOREIGN PATENT DOCUMENTS 0183406 6/1986 European Pat. Off. .
0385885 9/1990 European Pat. Off. .
2900631 7/1980 Germany .

OTHER PUBLICATIONS

Sands and Mackenrotts, "Encyclopedia of Electronic Circuits" *Signal Generation Circuits*, pp. 249–273.
Fletcher, "Clock and Oscillators", *An Engineering Approach to Digital Design*, textbook, pp. 297–302, published 1980.

*Primary Examiner*—Hoa T. Nguyen
*Attorney, Agent, or Firm*—Parkhurst, Wendel & Rossi

[57] ABSTRACT

A compact fail safe interface includes an astable multivibrator ring type oscillator that includes an odd number of inverting components. Power supply inputs of the inverting components of the oscillator constitute functional inputs to the interface. In the event that one of the inputs is not correctly supplied, the oscillator generates a continuous safe state output signal. The interface is particularly suited for use with voting modules designed to increase both the safety and the availability of an installation.

9 Claims, 4 Drawing Sheets

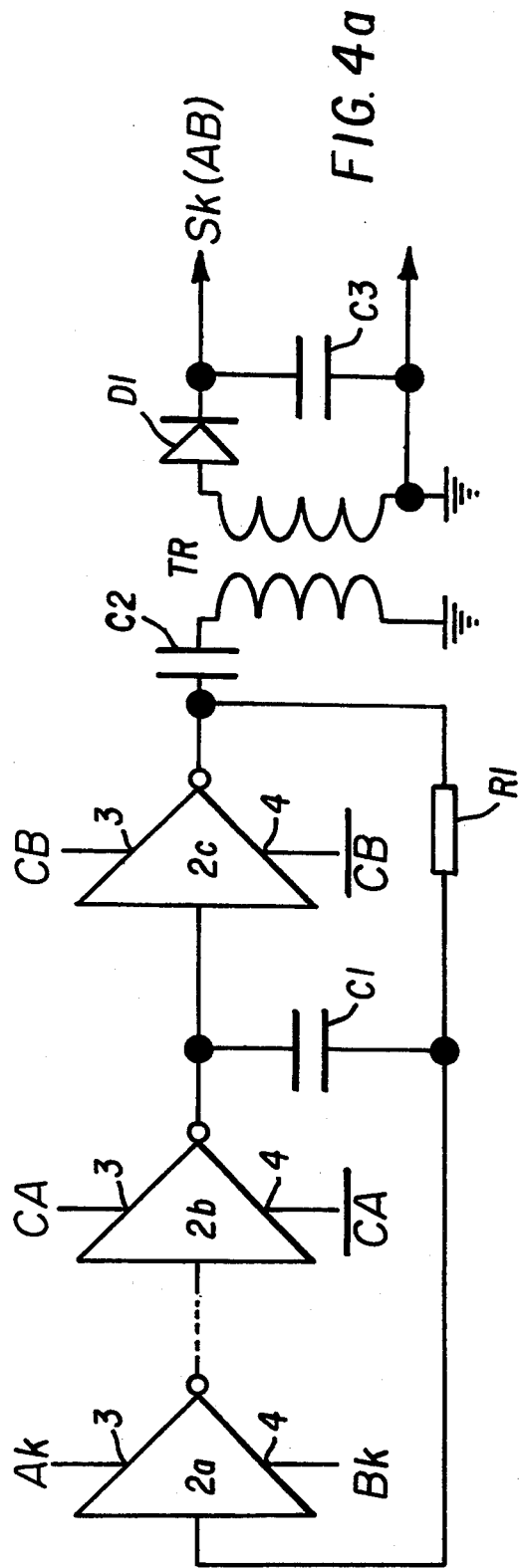
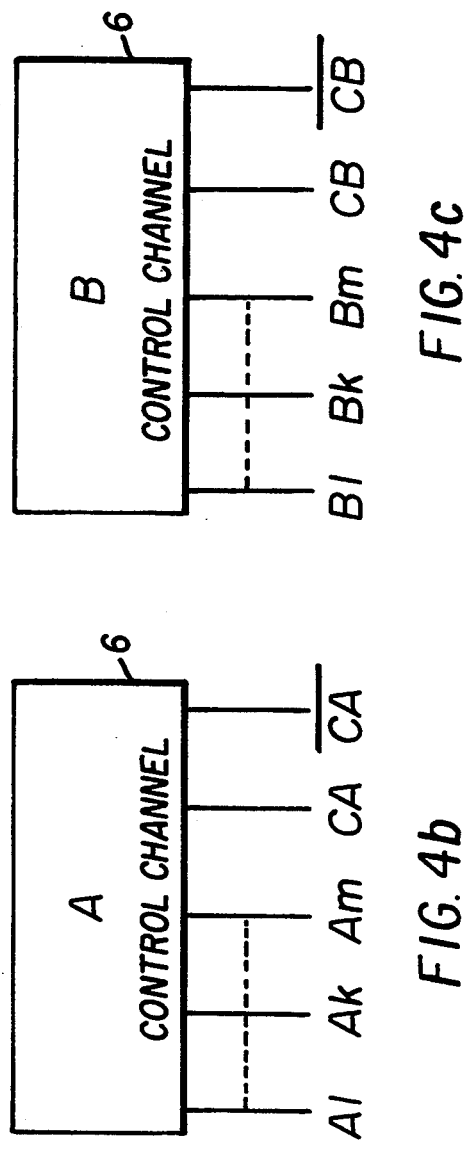
FIG. 4a
FIG. 4b
FIG. 4c

COMPACT FAIL SAFE INTERFACE AND VOTING MODULE INCLUDING THE COMPACT FAIL SAFE INTERFACE

BACKGROUND OF THE INVENTION

The invention relates to a compact fail safe interface. An interface of this kind is designed to be used in a strongly fail safe system.

Some fail safe systems make use of dynamic fail safe logic techniques. A strongly fail safe frequency coding system, enabling the dimensions of such systems to be appreciably reduced, is described in European patent EP-385,885. This type of system nevertheless presents the drawback of requiring a large number of components and of imperatively requiring a periodic off-line test to ensure the strongly fail safe property.

SUMMARY OF THE INVENTION

The object of the invention is to achieve a fail safe interface of much smaller dimensions than systems using dynamic logic techniques. This interface must also have a smaller power consumption and number of components and preferably not make use of the periodic off-line test to ensure the strongly fail safe property.

This object is achieved by the fact that it comprises an odd number of serially connected inverting components each comprising an input and an output, the output of a last inverting component being connected to the input of a first one, each inverting component comprising first and second power supply inputs constituting the interface inputs and to which binary logic interface input signals are applied, so as to supply an oscillating signal on output from the last inverting component when all the first power supply inputs of the inverting components are supplied by a signal of predetermined logic level and all the second power supply inputs of the inverting components are supplied by a signal of a logic level complementary to the previous one, and to supply a continuous signal in the opposite case.

An oscillator of the astable multivibrator ring type is thus obtained whose power supply inputs constitute the functional interface inputs. As soon as one of the inputs is not supplied correctly, the oscillator output signal is a continuous signal. Moreover, any failure internal to the interface does not alter the output or switches the latter to a state qualified as safe, corresponding to non-oscillation of the oscillator.

The output signal from the oscillator is preferably shaped in an output circuit comprising a transformer having a primary winding connected to the output of the last inverting component and a secondary winding connected to the interface output by means of a rectifier circuit.

Associating an on-line and off-line test device with the interface can enable the availability of a system comprising an interface of this kind to be increased.

An interface of this kind is more particularly suited to constituting voting modules designed to increase both the safety and the availability of an installation.

According to a development of the invention, a voting module connected to at least two independent control channels comprises at least one interface according to the invention, the power supply inputs of at least one inverting component of the interface receiving respectively a data signal from one of the channels and a complementary data signal from another channel.

Each control channel supplying a binary report signal and its complement to 1, this report signal being at said predetermined logic level in the case of correct operation of the channel and at the complementary logic level in the case of a failure being detected in the channel, the report signal of a channel and its complement are respectively applied to the first and second power supply inputs of another inverting component of the interface. The data signals transmitted by an interface can thus be validated only when the channel or channels from which they originate are in good operating state, and a reconfigurable voting module can be provided.

According to another development of the invention, the voting module comprises at least one complementary interface comprising at least one inverting component receiving on its power supply inputs complementary data signals from a first control channel, an inverting component receiving on its first and second power supply inputs respectively the report signal and its complement originating from the first channel, and an inverting component receiving on its second and first power supply inputs respectively the report signal and its complement originating from a second channel, so as to validate the data signals only when the first channel is operating correctly and the second channel has failed.

BRIEF DESCRIPTION OF THE DRAWINGS

Other advantages and features will become more clearly apparent from the following description of illustrative embodiments of the invention, given as non-restrictive examples only and represented in the accompanying drawings in which:

FIG. 4(a) represents an interface associated with a data bit delivered by two independent control channels shown in FIGS. 4(b) and 4(c) supplying complementary data bits.

DESCRIPTION OF THE PREFERRED EMBODIMENT

Figure 1:
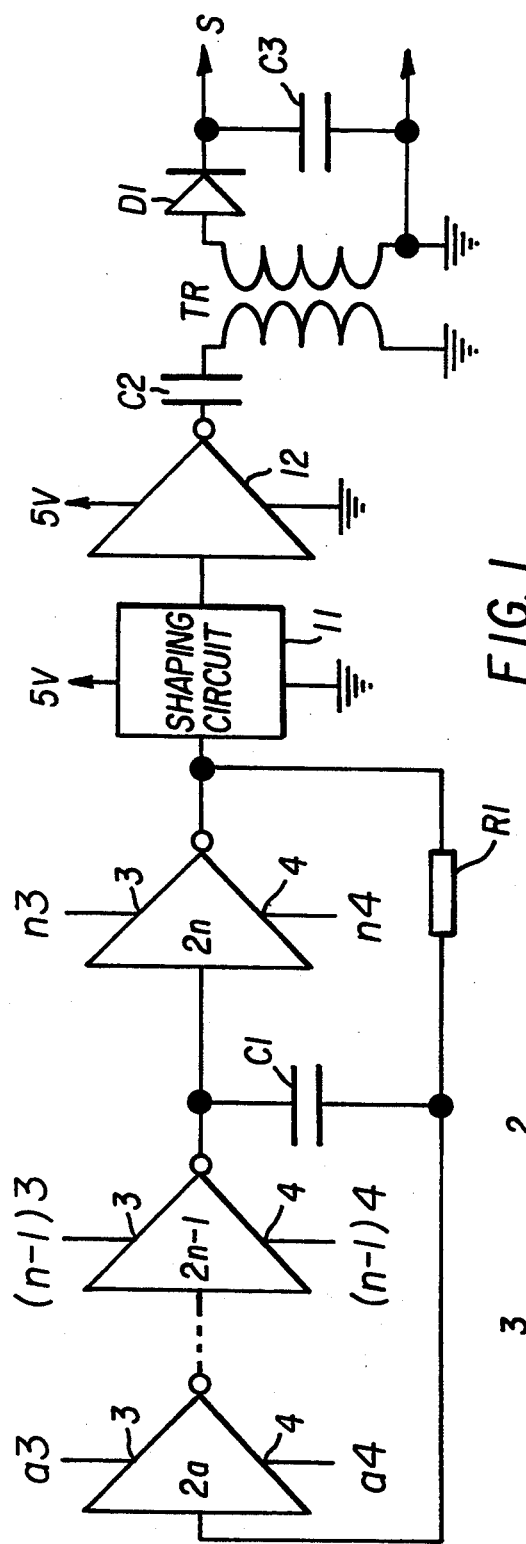
FIG. 1 represents, in block diagram form, a compact fail safe interface according to the invention.

The compact fail safe interface according to FIG. 1 comprises an oscillator of the astable multivibrator ring type formed by an odd number of inverting components 2, referenced 2a to 2n in the figure. These inverting components are serially connected, the output of the last inverting component 2n being connected to the input of the first inverting component 2a. The frequency of an oscillator of this kind is very high. This oscillation frequency can be reduced to a preset value by means of an RC circuit. In the embodiment represented in FIG. 1, a resistor R1 is serially connected with a capacitor C1 between the output and input of the inverting component 2n, the common point of the resistor R1 and capacitor C1 being connected to the input of the inverting component 2a. The same result can be obtained by means of an RC circuit connected to the terminals of any odd number of inverting components of the oscillator.

Each inverting component 2 comprises two power supply inputs 3 and 4. Each inverting component 2 receives on its power supply inputs logic interface input signals, respectively a3 to n3 on the power supply inputs 3 of the inverting components 2a to 2n and a4 to n4 on the corresponding power supply inputs 4.

The interface input signals are binary logic signals. For oscillation to take place, all the signals a3 to n3 applied to the power supply inputs 3 must have the same logic value, for example 1, and all the signals a4 to n4 applied to the power supply inputs 4 must have a logic value complementary to the previous one, 0 in the example involved. As soon as one of the input signals no longer complies with these conditions, the corresponding inverting component is turned off and oscillation no longer takes place.

Figure 2:
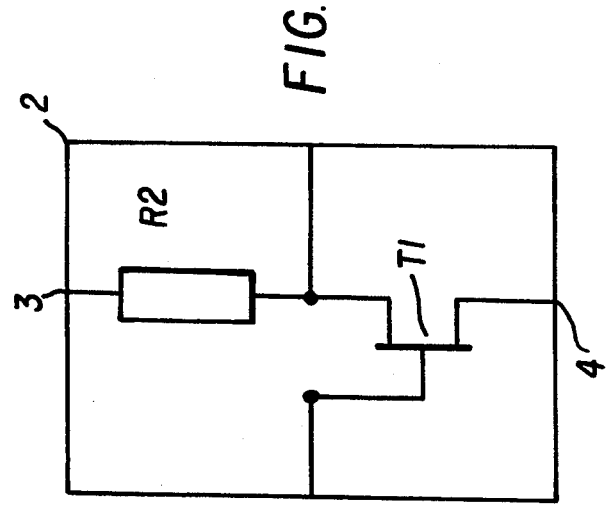
FIG. 2 illustrates a particular embodiment of an inverting component of the interface in FIG. 1.

The particular embodiment of an inverting component 2 represented in FIG. 2 comprises a transistor T1, for example of the MOS type, and a resistive component R2 serially connected between the power supply inputs 3 and 4. Their common point is connected to the output of the inverter, whereas the inverter input is connected to the transistor gate. To operate correctly the inverter 2 is supplied by a logic signal 1 on its input 3 and by a complementary logic signal 0 on its input 4. If a logic signal 1 is present on the inverter input, the transistor T1 is turned on, and the output is switched to logic level 0. If on the other hand a logic signal 0 is applied to the inverter input, the transistor T1 is turned off, and the output is switched to logic level 1.

Figure 3:
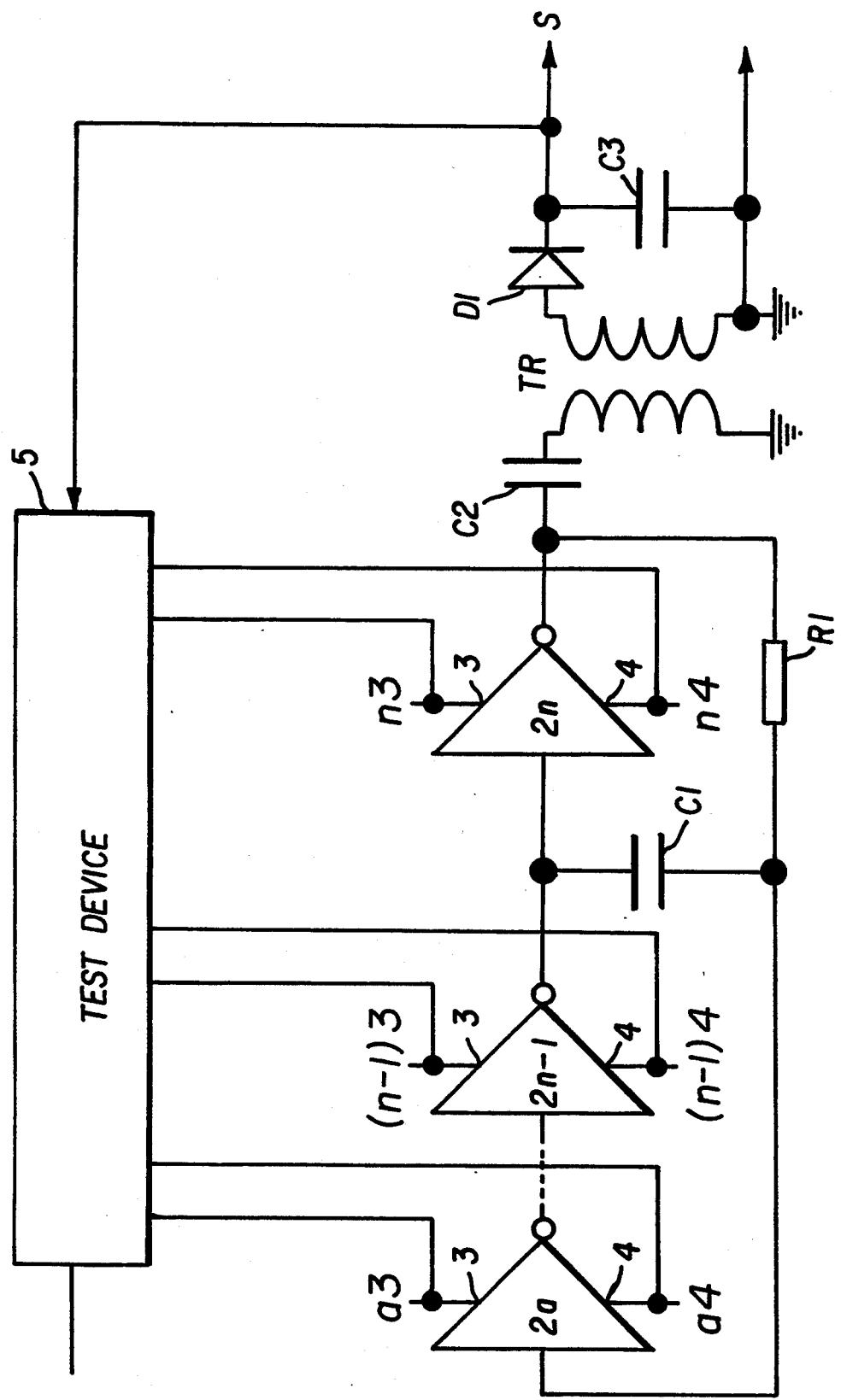
FIG. 3 represents the association of an interface according to FIG. 1 and a test device.

At the oscillator output, the interface (FIG. 1) comprises an output circuit designed to shape the oscillator output signal. When inverters as in FIG. 2 are used, it is preferable to amplify the oscillator output signal and the output circuit then comprises a shaping circuit 11 whose output is connected to the input of an amplifier 12, and this output circuit comprises a pulse transformer TR whose primary winding is connected to the output of the amplifier 12 by means of a capacitor C2 designed to perform demagnetization of the transformer. The shaping circuit 11 and amplifier 12 (not represented in FIGS. 3 and 4) are supplied by a suitable supply voltage, for example 5 V. The signal collected at the terminals of the secondary winding of the transformer is rectified to supply an interface output signal S. In FIG. 1, rectifying is achieved by means of a diode D1, serially connected with the secondary winding, and a capacitor C3 connected in parallel to the interface output.

In the absence of a failure intrinsic to the interface and when the logic input signals are at logic level 1 on the inputs 3 of the inverting components and at logic level 0 on their inputs 4, the oscillator is operating and an oscillating signal is applied to the terminals of the primary winding of the transformer. This signal is rectified on the transformer secondary and the interface output signal S has a high level (logic level 1) with continuous voltage, for example 5 V.

If on the other hand the oscillator is not operating, a continuous signal is present on its output and this continuous signal is transformed by the transformer into a low level signal (logic level 0) with continuous voltage, i.e. 0 V.

If the level 0, low level with continuous voltage, of the interface output signal S is arbitrarily designated as being a safe state and its level 1, high continuous level, as an unsafe state, it can be shown that the interface described above has, due to its design, the property of being a strongly fail safe system, i.e. a system which remains safe, even in the presence of multiple failures. In other words, whatever the input signals (a3 to n3, a4 to n4) applied to the interface, a single failure (short-circuit, open circuit, etc.) internal to the interface leads to the output S being placed, either in the safe state, i.e. at level 0, or in the state corresponding to the input signals, i.e. level 1 if the signals a3 to n3 are at level 1 and signals a4 to n4 at level 0, and at level 0 if at least one of the signals a3 to n3 is at level 0 or if at least one of the signals a4 to n4 is at level 1.

The same is the case in the presence of a second failure internal to the interface or of multiple failures.

The interface can be associated with a test device 5 (FIG. 3) designed to detect a failure internal to the interface. For this purpose, the test device, connected to the inputs 3 and 4 of the interface inverting components and to the interface output S, checks the consistency between the values of the input signals of the interface and the value of its output signal. As a failure in the interface does not alter operation of the latter or leads to a safe state, low level of the signal S in the example described above, the test device detects the failures leading to safe state whereas the output should be at high level, i.e. when the inputs a3 to n3 are at 1 and the inputs a4 to n4 at 0. This test is performed on-line, i.e. it does not affect operation of the interface, and detection of a failure in the interface is indicated by the test device to a suitable monitoring unit. A failure of this type, although it does not jeopardize the safety of the system, makes the data which should be transmitted by the interface unavailable. Duplication of the interfaces, each associated with a test device, not only enables safety of the system to be achieved but also ensures its availability.

To enable an interface failure to be detected even when the inputs a3 to n3 remain at 0 and the inputs a4 to n4 at 1 for a fairly long time, the test device is designed in such a way as to periodically perform an off-line test. It applies simultaneously, for a preset duration, much lower than the duration of a binary input signal, a signal 1 to the inputs 3 and a signal 0 to the inputs 4 of the interface. If the output signal S is at 0 it then switches to state 1 in the absence of a failure internal to the interface. The duration of the off-line test is sufficiently short in comparison with the normal duration of a bit for any modification of the signal S to be considered as a disturbance by a system located downline from the interface. The signal S switching to 1 is on the other hand detected by the test device, which indicates the failure in its absence.

The data applied to the interface can be constituted by the output data from a controller, a computer, or a control channel. If this data is binary, double rail coded data, i.e. data in which each bit is associated with its complement, an interface is associated with each data bit. In the minimum embodiment, this interface comprises a single inverting component whose output is connected to the input and receiving the bit involved on its power supply input 3, and its complement on its power supply input 4. In practice, a control channel of this kind comprises a watchdog circuit, designed to detect any failure of the functional part of the channel. The watchdog circuit supplies a report bit C and its complement C. The report bit and its complement are then applied respectively to the inputs 3 and 4 of a second inverting component of the interface, so as to validate or not the data supplied by the control channel.

As the interface has to comprise an odd number of inverting components, the inputs 3 and 4 of the third inverting component can be placed respectively at 1 and at 0.

Controllers, computers, or control channels supplying double rail coded binary data are complex and costly. The embodiment represented in FIGS. 4(a), 4(b) and 4(c) enables the same result to be obtained using two standard control channels. In these figures, two control channels 6 are referenced respectively A and B. Channel A delivers binary data Al, ... Ak, ... Am, plus a report bit CA and its complement $\overline{CA}$ representative of correct operation of the channel. This data is coded in voltage, for example 5 V for logic level 1 and 0 V for logic level 0. Channel B delivers binary data Bl, ... Bk, ... Bm, complementary to the data supplied by channel A (Bk=$\overline{Ak}$) plus a report bit CB and its complement $\overline{CB}$.

An interface with three inverting components 2a, 2b and 2c is associated with each data bit of channel A. Only the interface associated with the bit Ak is represented in FIG. 4. The bit Ak is applied to the input 3 of the first inverting component 2a and its complement Bk to the corresponding input 4. The bits CA and $\overline{CA}$ are respectively applied to the inputs 3 and 4 of the second inverter 2b and the bits CB and $\overline{CB}$ to the inputs 3 and 4 of the third inverter 2c. The interface thus constitutes a 2/2 voting module. The interface output signal Sk (AB) is only at level 1 if no failure internal to the interface forces the output to zero and if Ak=1, Bk=0, CA=CB=1, $\overline{CA}=\overline{CB}$=0, i.e. if the data of order k supplied by the channels A and B is consistent (2/2 vote), and if their watchdogs are not faulty and have not detected a failure affecting the functional part of the channels. The output Sk (AB) switches to level 0, or safe level, in all other cases, i.e.

- as soon as the watchdog of one of the channels indicates that something is wrong in this channel (CA or CB=0),
- when a failure affects one of the watchdogs (CA=$\overline{CA}$ or CB=$\overline{CB}$),
- when the data supplied by the two channels is not consistent (Ak=Bk),
- if the data Ak=$\overline{Bk}$=0,
- if the interface has an intrinsic failure switching it to fail safe state regardless of the data applied to its inputs.

Figure 5:
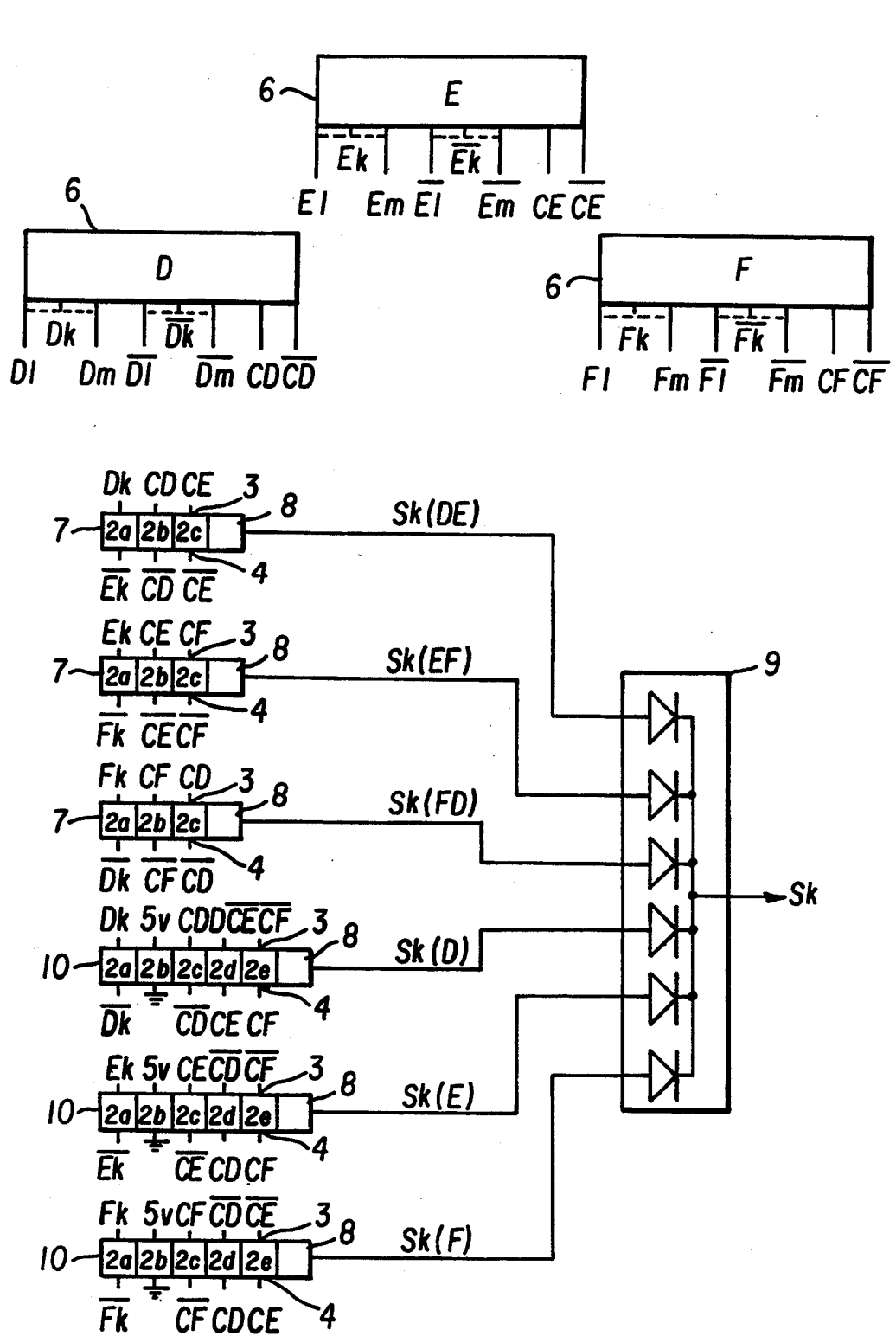
FIG. 5 illustrates, in schematic form, a reconfigurable voting module formed by interfaces according to the invention.

FIG. 5 represents a 2/3 voting module formed by a plurality of compact fail safe interfaces according to the invention. The module is connected to three identical and independent control channels 6, referenced D, E and F. Each channel delivers binary data coded in voltage respectively Dl ... Dk ... Dm, El .. Ek .. Em, Fl .. Fk .. Fm, their complements to 1, a report bit, respectively CD, CE and CF, and its complement to 1, $\overline{CD}$, $\overline{CE}$ and $\overline{CF}$ (double rail coding).

The 2/3 voting module comprises three interfaces 7, with three inverting components, of the type represented in FIG. 4. In order not to overburden the figure unnecessarily, each interface has been represented by blocks with two inputs (3 and 4) corresponding to the number of inverting components and bearing the same reference 2a, 2b or 2c as the associated inverting component, and a block 8 representing the output circuit. The inverting component 2a of the first interface 7 receives the signal Dk on its input 3 and the signal $\overline{Ek}$ on its input 4. The inverting component 2b receives the signals CD and $\overline{CD}$ respectively on its inputs 3 and 4, whereas the inverting component 2c receives the signals CE and $\overline{CE}$ respectively on its inputs 3 and 4. This interface therefore performs a 2/2 vote between the bits Dk and $\overline{Ek}$, this data being validated by the report bits of the corresponding channels D and E. The output signal of this interface has been referenced Sk(DE). Likewise, the second interface 7 produces an output signal Sk(EF) corresponding to a 2/2 vote between the bits Ek and $\overline{Fk}$, respectively applied to the inputs 3 and 4 of its first inverting component 2a. This data is validated by channels E and F whose bits CE and $\overline{CE}$ are respectively applied to the inputs 3 and 4 of inverting component 2b, and bits CF and $\overline{CF}$ to the inputs 3 and 4 of inverting component 2c. Likewise the third interface 7 produces an output signal Sk (FD) from the bits Fk and $\overline{Dk}$ on inputs 3 and 4 of inverter 2a, CF and $\overline{CF}$ on inputs 3 and 4 of inverter 2b, and CD and $\overline{CD}$ on inputs 3 and 4 of inverter 2c. The outputs Sk ( DE ), Sk ( EF ) and Sk ( FD ) of the three interfaces are applied to the inputs of a logic OR circuit 9, which supplies on output a voting module output signal Sk, relative to the bit of order k. The assembly formed by the three interfaces and the OR circuit, of the hard-wired type, formed for instance by a simple diode OR, constitutes a 2/3 voting module with respect to the order k data supplied by the three channels D, E and F.

In the event of failure of one of the channels, not detected by its watchdog, the module supplies a signal Sk representative of the value of the bit of order k supplied by the two non failed channels. Thus, for example, if Dk=Ek=1, $\overline{Dk}=\overline{Ek}$=0, but Fk=0 and $\overline{Fk}$=1, whereas CD=CE=CF=1 and $\overline{CD}=\overline{CE}=\overline{CF}$=0 (failure of channel F not detected by its watchdog), the interfaces 7 respectively supply the signals Sk(DE)=1, Sk(EF)=0 and Sk(FD)=0 and the output signal Sk is equal to Sk(DE)=1. Inversely, if Dk=Ek=0, $\overline{Dk}=\overline{Ek}$=1, Fk=1 and $\overline{Fk}$=0, we obtain Sk(DE)=Sk(EF)=Sk(FD)=0.

This voting module is automatically reconfigured as a 2/2 voting module when one of the channels fails, this failure being detected by its watchdog. If the watchdog of channel D detects a failure of this channel, the bit CD becomes 0 and the bit $\overline{CD}$ goes to logic level 1, forcing the outputs Sk(DE) and Sk(FD) of the first and third interfaces to 0, the inverting components receiving these signals, respectively 2b and 2c, no longer being supplied correctly. Only the second interface is operating normally, supplying the signal Sk(EF) corresponding to a 2/2 vote between the two remaining channels.

It can easily be checked that if only channel E has a failure, only the interface producing the signal Sk(FD) operates normally and that if only channel F has a failure, it is the interface producing the signal Sk(DE) that takes over, performing a 2/2 vote.

The voting module represented in FIG. 5 comprises three complementary compact fail safe interfaces, with five stages. Each interface is of the same type as that represented in FIG. 1, each interface being as before schematized by an output block 8 and blocks with two power supply inputs ( 3 and 4 ) corresponding to the five inverting components it contains and bearing the same reference 2a,2b,2c,2d or 2e, as the associated inverting component.

Each interface 10 only takes account of the data provided by one measuring channel. The bits Dk and $\overline{Dk}$ are respectively applied to the inputs 3 and 4 of the inverting component 2a of the first interface 10 which supplies a signal Sk(D). Likewise, the bits Ek and $\overline{Ek}$ are respectively applied to the inputs 3 and 4 of the inverting component 2a of the second interface 10 which supplies a signal Sk(E) and the bits FK and $\overline{FK}$ are respectively applied to the inputs 3 and 4 of the inverting component 2a of the third interface 10 which supplies a signal Sk(F). The first interface 10 is only validated when channel D is operating normally, CD and $\overline{CD}$ being applied respectively to the inputs 3 and 4 of an inverting component 2c, whereas a failure has been detected by the watchdogs of channels E and F. Indeed, $\overline{CE}$ and CE are respectively applied to the inputs 3 and 4 of an inverting component 2d and $\overline{CF}$ and CF to the inputs 3 and 4 of an inverting component 2e. Likewise, the second interface 10, with output Sk(E) is only validated when channel E is operating normally (CE and $\overline{CE}$ on inputs 3 and 4 of 2c) and a failure has been detected by the watchdogs of channels D ($\overline{CD}$ and CD on inputs 3 and 4 of 2d) and F ($\overline{CF}$ and CF on inputs 3 and 4 of 2e). The third interface 10, with output Sk(F) is only validated when channel F is operating correctly (CF and $\overline{CF}$ on inputs 3 and 4 of 2c) and a failure has been detected in channels D ($\overline{CD}$ and CD on inputs 3 and 4 of 2d) and E ($\overline{CE}$ and CE on inputs 3 and 4 of 2e). Each of the interfaces 10 comprises an inverting component 2b whose inputs 3 and 4 are respectively switched to 5 V and to ground, so as to comprise an odd number of inverting components.

Due to the presence of the complementary interfaces 10, the 2/3 voting module in FIG. 5, which is automatically reconfigured as a 2/2 voting module in the event of failure of one of the channels, only takes into account the data from the remaining channel when a second channel has failed. In this case, operation of the system is downgraded but this enables the availability of the overall assembly to be increased.

It may be desirable to be able to indicate to a monitoring device located upline that the module is operating in 2/2 voting or 1/1 voting. This can be achieved by any appropriate means, by means of the report bits of the three channels.

The voting modules represented in FIGS. 4 and 5 do not take account of possible internal failures of one or more interfaces composing them. If it is desired to further increase the availability of the assembly, a test device of the same type as the one described with reference to FIG. 3 can be used. This test device can detect failure of an interface and replacement of the failed interface by a complementary interface can be provided for. To achieve this, it is possible for example to provide a complementary interface comprising an inverting component put into operation either directly or by means of one of the measuring channels by a failure signal produced by the test device. The compact fail safe interface according to the invention can be completed in a suitable manner to validate the data applied to one of its inverting components according to a predetermined number of criteria.

The odd number of inverting components of an interface varies preferably between 3, to perform reading of a data item and its validation, and about a hundred in the most complex cases.

The inverting component assembly can easily be integrated.

We claim:

1. A compact fail safe interface comprising:
   interface inputs; an interface output; an odd number of serially connected inverting components, each inverting component including an input, an output, and first and second power supply inputs, said first and second power supply inputs constituting said interface inputs, wherein the output of a last inverting component of the serially connected inverting components is connected to the interface output and to the input of a first inverting component of the serially connected inverting components; signal means for applying binary logic interface signals having a first predetermined logic level and a second logic level to said interface inputs; and a test device connected to said interface inputs and interface output for checking the consistency between signals applied to said interface inputs and signals present on said interface output, and for generating a failure signal representative of an interface failure in the absence of said consistency; and
   wherein an oscillating signal is generated on the output of the last inverting component only when the binary logic interface input signals applied to the first power supply inputs of the inverting components by the signal means have a first predetermined logic level while the binary logic interface input signals applied to the second power supply inputs of the inverting components by the signal means have a second logic level, said second logic level being complementary to said first predetermined logic level.

2. The interface according to claim 1, wherein said test device periodically applies predetermined test signals to said interface inputs, said test signals having a preset duration much shorter than a duration of one of said binary logic interface input signals.

3. A compact fail safe interface comprising:
   interface inputs; an interface output; an odd number of serially connected inverting components, each inverting component including an input, an output, and first and second power supply inputs., said first and second power supply inputs constituting said interface inputs, wherein the output of a last inverting component of the serially connected inverting components is connected to the interface output and to the input of a first inverting component of the serially connected inverting components; and signal means for applying binary logic interface signals to said interface inputs;
   wherein an oscillating signal is generated on the output of the last inverting component only when the binary logic interface input signals applied to the first power supply inputs of the inverting components by the signal means have a first predetermined logic level while the binary logic interface input signals applied to the second power supply inputs of the inverting components by the signal means have a second logic level, said second logic level being complementary to said first predetermined logic level; and
   wherein a continuous signal is generated on the output of the last inverting component when the binary logic interface input signals applied to first and second power supply inputs are indicative of a failure.

4. The interface according to claim 3, further comprising an output circuit for shaping said oscillating signal, said output circuit including a transformer having a primary winding connected to the output of the last inverting component and a secondary winding connected to the interface output by means of a rectifier circuit.

5. The interface according to claim 4, further comprising a capacitor for demagnetizing said transformer, wherein said capacitor is serially connected with the primary winding of the transformer to the output of the last inverting component.

6. The interface according to claim 3, further comprising an RC circuit for reducing to a preset value the oscillation frequency of said oscillation signal, wherein said RC circuit is connected between the input of the first inverting component and the output of the last inverting component of the serially connected inverting components.

7. A fail safe interface apparatus comprising:
a voting module connected to at least two independent control channels, said voting module comprising: at least one compact fail safe interface including interface inputs; an interface output; an odd number of serially connected inverting components, each inverting component including an input, an output, and first and second power supply inputs, said first and second power supply inputs constituting said interface inputs, wherein the output of a last inverting component of the serially connected inverting components is connected to the interface output and to the input of a first inverting component of the serially connected inverting components; and signal means for applying binary logic interface signals having a first predetermined logic level and a second logic level to said interface inputs;
wherein an oscillating signal is generated on the output the last inverting component only when the binary logic interface input signals applied to the first power supply inputs of the inverting components by the signal means have a first predetermined logic level while the binary logic interface input signals applied to the second power supply inputs of the inverting components by the signal means have a second logic level, said second logic level being complementary to said first predetermined logic level;
wherein a continuous signal is generated on the output of the last inverting component when the binary logic interface input signals applied to first and second power supply inputs are indicative of a failure; and
wherein the first and second power supply inputs of at least one inverting component of the interface respectively receive a data signal from one of the two independent control channels and a complementary data signal from another of the two independent control channels.

8. The voting module according to claim 7, wherein each control channel generates a binary report signal and its complement to 1, wherein the report signal is at a predetermined logic level in the case of correct operation of the channel and at a complementary logic level when a failure is detected in the channel, the report signal of a channel and its complement being respectively applied to said first and second power supply inputs of another inverting component of the interface.

9. The voting module according to claim 7, further comprising means for connecting the first and second power supply inputs of an inverting component not connected to outputs of a control channel respectively to said predetermined logic level and to said second logic level.

* * * * *